(12) United States Patent
Li et al.

(10) Patent No.: US 7,965,496 B2
(45) Date of Patent: Jun. 21, 2011

(54) FIXING MECHANISM FOR FIXING A BOARD AND RELATED ELECTRONIC DEVICE

(75) Inventors: Chen-Yu Li, Taipei Hsien (TW); Meng-Chou Lee, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 71 days.

(21) Appl. No.: 12/631,846

(22) Filed: Dec. 6, 2009

(65) Prior Publication Data

US 2010/0246105 A1 Sep. 30, 2010

(51) Int. Cl.
*H05K 5/00* (2006.01)
*H05K 7/00* (2006.01)

(52) U.S. Cl. ......... 361/679.01; 361/679.02; 361/679.27; 361/679.31

(58) Field of Classification Search ............. 361/679.01, 361/679.02, 679.27, 679.31
See application file for complete search history.

(56) References Cited

U.S. PATENT DOCUMENTS

| | | | |
|---|---|---|---|
| 6,657,857 B2 * | 12/2003 | Lan | 361/679.33 |
| 6,741,457 B2 * | 5/2004 | Huang | 361/679.32 |
| 6,886,174 B2 * | 4/2005 | Huang et al. | 720/600 |
| 7,100,876 B2 | 9/2006 | Tseng | |
| 2009/0009955 A1 * | 1/2009 | Motoe | 361/685 |
| 2009/0284903 A1 * | 11/2009 | Wu | 361/679.01 |

* cited by examiner

*Primary Examiner* — Jayprakash N Gandhi
*Assistant Examiner* — Anthony M Haughton
(74) *Attorney, Agent, or Firm* — Winston Hsu; Scott Margo

(57) ABSTRACT

A fixing mechanism includes a base whereon a protrusion is formed, an elastic component installed inside the base, and a supporting component wedged inside the base. An end of the supporting component contacts against the elastic component, and the other end of the supporting component is for supporting a board. The fixing mechanism further includes a clamping frame pivoted to the base. A slot is formed on the clamping frame. The clamping frame and the supporting component clamp the board together when the protrusion of the base is inserted inside the slot on the clamping frame.

20 Claims, 8 Drawing Sheets

FIXING MECHANISM FOR FIXING A BOARD AND RELATED ELECTRONIC DEVICE

BACKGROUND OF THE INVENTION

1. Field of the Invention

The present invention relates to a fixing mechanism for fixing two objects, and more particularly, to a fixing mechanism for fixing a board on a base with a rotational mechanism and a related electronic device.

2. Description of the Prior Art

With the rapid development of information technology, computer systems are playing an important role in modernizing many companies, which now are widely used in practically every industry. Due to the increase in data storage density, the improvement in clock speed, and the decrease in production costs, the manufacturing of portable computers has become a mainstream business in the computer industry. In general, the computer system includes a case for covering and protecting internal components. Sometimes a circuit board, such as a motherboard, is screwed to a boss of the case. However, because the circuit board is not screwed in equilibrium due to mechanical tolerance, the circuit board is not level so as to induce planar stress. It might cause local failure due to stress concentration, and electronic components on the circuit board break easily when an impact is applied to the circuit board. For example, tapped holes of the circuit board and chips disposed around positioning holes are broken easily. In addition, clamping the circuit board by screws spends assembly labor hours. Thus, design of a fixing mechanism capable of fixing the circuit board effectively is an important issue in the mechanical industry.

SUMMARY OF THE INVENTION

The present invention provides a fixing mechanism for fixing a board on a base with a rotational mechanism and a related electronic device for solving above drawbacks.

According to the claimed invention, a fixing mechanism includes a base, whereon a protrusion and a first hole are formed, an elastic component installed inside the base, and a supporting component wedged inside the base. An end of the supporting component contacts against the elastic component, and the other end of the supporting component supports a first object. The fixing mechanism further includes a clamping frame pivoted to the base. A slot is formed on the clamping frame, and the clamping frame and the supporting component are for clamping the first object together when the protrusion of the base is inserted inside the slot. The clamping frame includes a shaft inserted into the first hole so that the clamping frame is pivoted to the base. The fixing mechanism further includes a fixing component for clamping a second object with the base.

According to the claimed invention, the base is a hollow cylindrical structure.

According to the claimed invention, a guiding slot is formed on the base, and the supporting component includes a hook for hooking inside the guiding slot.

According to the claimed invention, a second hole is formed on the first object, a breach is formed on an end of the clamping frame, and the supporting component further includes a pin for inserting into the second hole of the first object and the breach of the clamping frame so as to fix the first object.

According to the claimed invention, the fixing mechanism further includes a grounding portion disposed on a side of the base. The fixing component is a grounding component for electrically connecting to the grounding portion and for contacting with the shaft so as to ground the first object.

According to the claimed invention, the fixing component is a screw.

According to the claimed invention, the first object is a board.

According to the claimed invention, the board is a circuit board.

According to the claimed invention, the elastic component is a spring.

According to the claimed invention, an electronic device includes a cover, a board disposed inside the cover, and a fixing mechanism for fixing the board inside the cover. The fixing mechanism includes a base disposed on a side of the cover, whereon a protrusion and a first hole are formed, an elastic component installed inside the base, and a supporting component wedged inside the base. An end of the supporting component contacts against the elastic component, and the other end of the supporting component supports the board. The fixing mechanism further includes a clamping frame pivoted to the base. A slot is formed on the clamping frame, and the clamping frame and the supporting component clamp the first object together when the protrusion of the base is inserted inside the slot. The clamping frame includes a shaft inserted into the first hole so that the clamping frame is pivoted to the base. The fixing mechanism further includes a fixing component for clamping the cover on the base.

According to the claimed invention, a third hole is formed on the cover, and the fixing component passes through the third hole for contacting with the shaft.

According to the claimed invention, the grounding portion is made of conductive material formed on the cover by sputtering or evaporating.

According to the claimed invention, the electronic device further includes a storage module, and the board is a frame for covering the storage module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
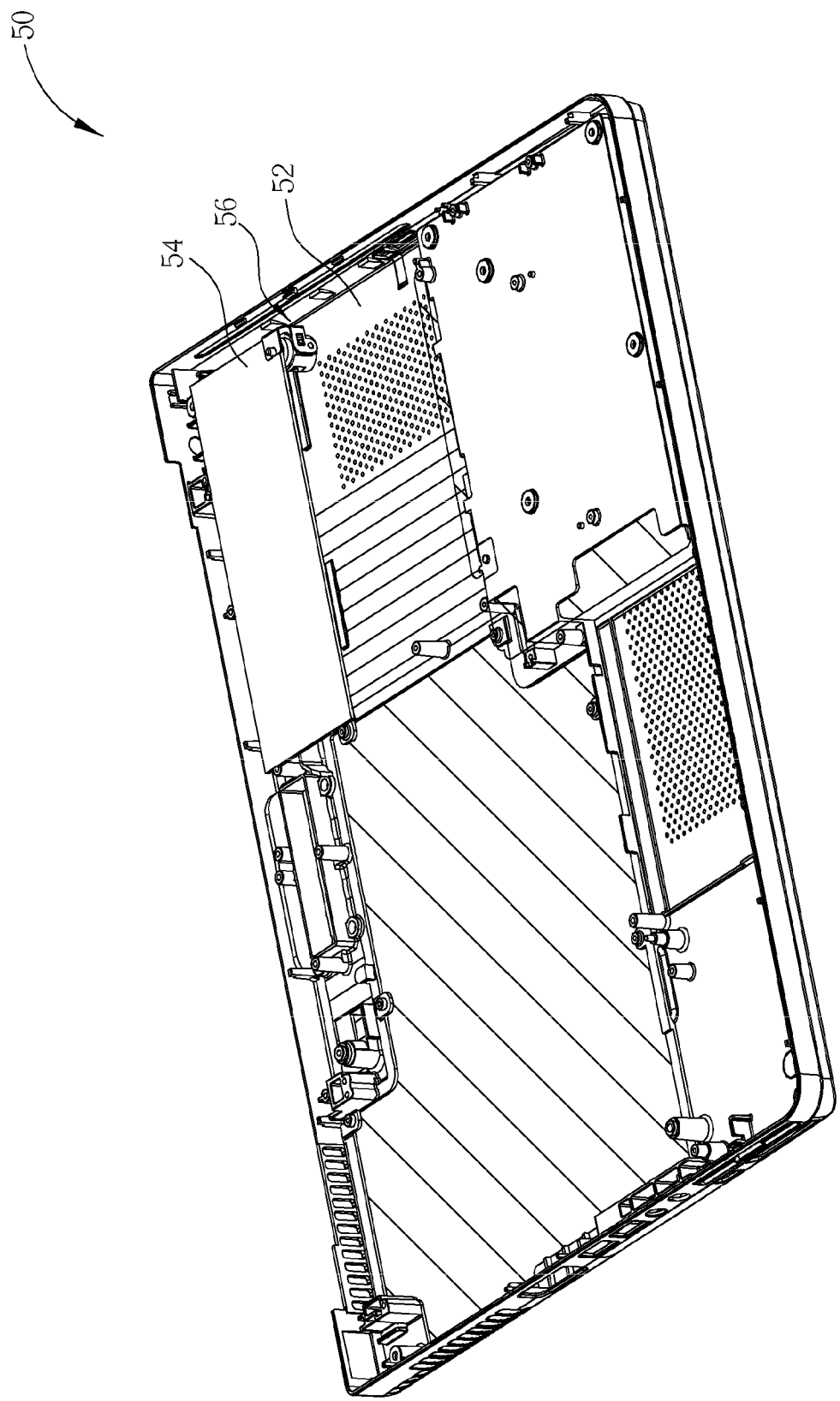
FIG. 1 is a diagram of an internal structure of an electronic device of the present invention.
Figure 2:
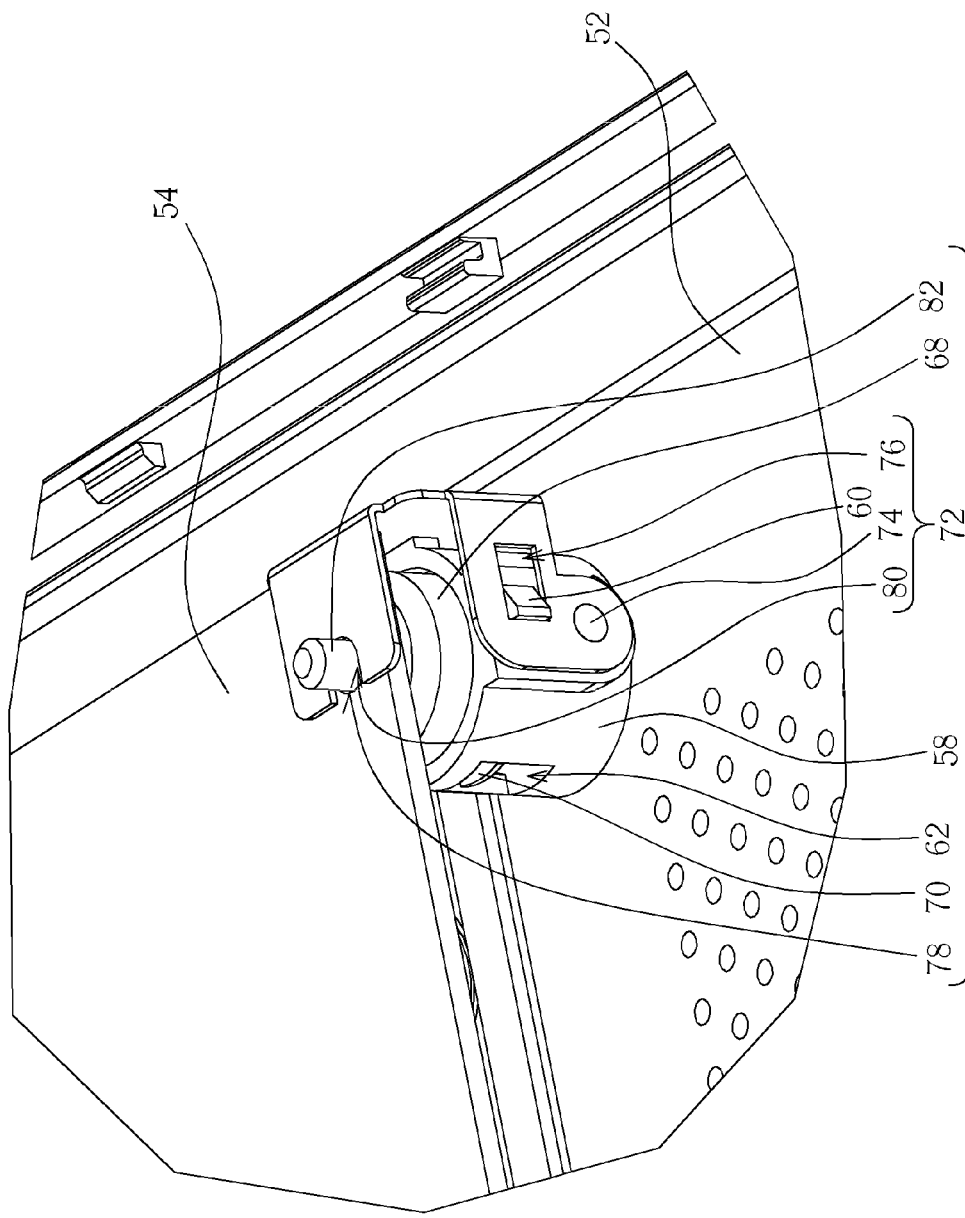
FIG. 2 is an enlarged diagram of the fixing mechanism installed on the cover of the present invention.
Figure 3:
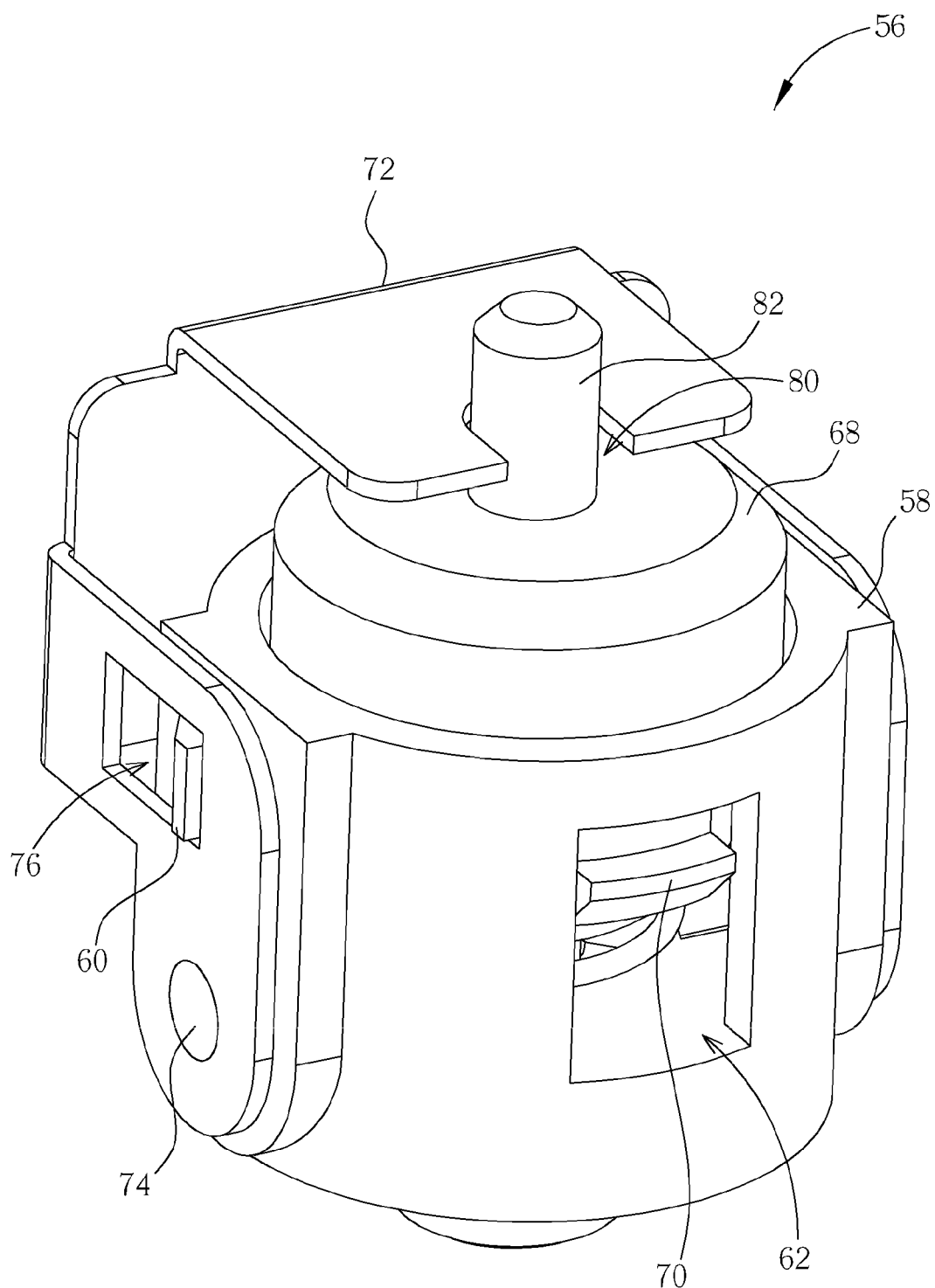
FIG. 3 is a diagram of the fixing mechanism of the present invention.
Figure 4:
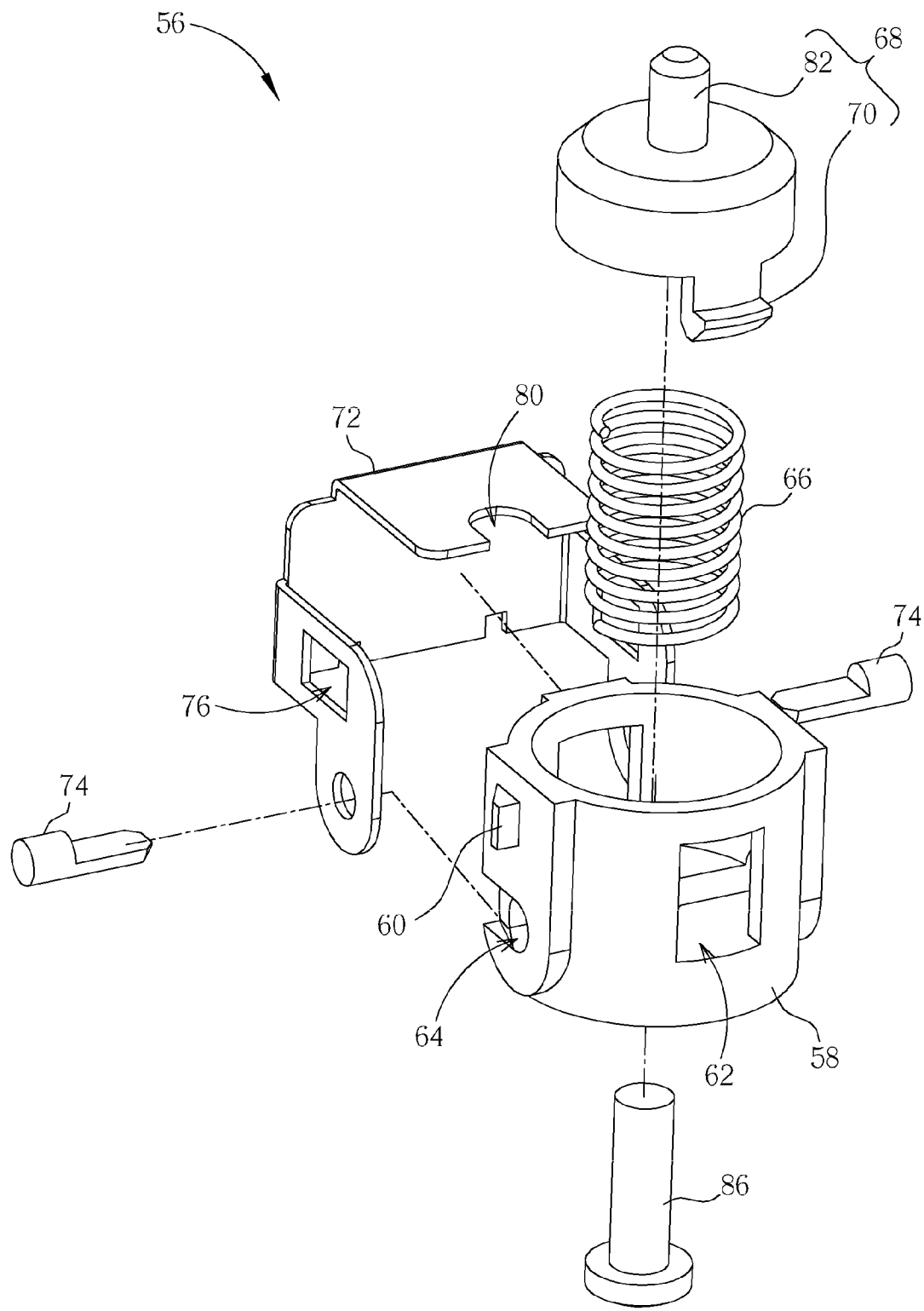
FIG. 4 is an exploded diagram of components of the fixing mechanism of the present invention.

Please refer to FIG. 1. FIG. 1 is a diagram of an internal structure of an electronic device 50 of the present invention. The electronic device 50 can be a notebook computer. The electronic device 50 includes a cover 52 (a second object), a board 54 (a first object) disposed inside the cover 52, and a fixing mechanism 56 for fixing the board 54 inside the cover 52. The cover 52 can be a bottom casing. The board 54 can be a circuit board, such as a main board. Please refer to FIG. 2, FIG. 3, and FIG. 4. FIG. 2 is an enlarged diagram of the fixing mechanism 56 installed on the cover 52 of the present invention. FIG. 3 is a diagram of the fixing mechanism 56 of the present invention. FIG. 4 is an exploded diagram of components of the fixing mechanism 56 of the present invention. The fixing mechanism 56 includes a base 58 disposed on a side of the cover 52. The base 58 includes at least one protrusion 60, at least one guiding slot 62, and at least one first hole 64. The base 58 can be a hollow cylindrical structure. The fixing mechanism 56 further includes an elastic component 66 installed inside the base 58. The elastic component 66 can be a spring. The fixing mechanism 56 further includes a supporting component 68, which includes at least one hook 70 for hooking inside the guiding slot 62 of the base 58, so that the supporting component 68 is combined with the base 58. An end of the supporting component 68 contacts against the elastic component 66, and the other end of the supporting component 68 is for supporting the board 54. The fixing mechanism 56 further includes a clamping frame 72 pivoted to the base 58, which means the clamping frame 72 includes at least one shaft 74 for inserting into the first hole 64 of the base 58, so that the clamping frame 72 is pivoted to the base 58.

In addition, a slot 76 is formed on the clamping frame 72. When the clamping frame 72 rotates relative to the base 58 to a clamping position as shown in FIG. 1, the protrusion 60 of the base 58 is inserted into the slot 76 of the clamping frame 72, so that the clamping frame 72 can be fixed on the base 58. Meanwhile, the clamping frame 72 and the supporting component 68 clamp the board 54 together. A second hole 78 is formed on the board 54, a breach 80 is formed on an end of the clamping frame 72, and the supporting component 68 further includes a pin 82 for inserting into the second hole 78 of the board 54 and the breach 80 of the clamping frame 72 so as to fix the board 54.

Assembling sequences of the fixing mechanism 56 for fixing the board 54 are introduced as follows. First, the second hole 78 of the board 54 is aligned with the pin 82 of the supporting component 68, and the pin 82 of the supporting component 68 is inserted into the second hole 78 of the board 54, so that the board 54 is put on the supporting component 68. Then, the clamping frame 72 is rotated relative to the base 58 to the clamping position as shown in FIG. 1. At this time, the protrusion 60 of the base 58 is inserted into the slot 76 of the clamping frame 72, so that the clamping frame 72 is fixed on the base 58 and the pin 82 of the supporting component 68 is inserted into the breach 80 of the clamping frame 72 so as to position the clamping frame 72. Therefore, the clamping frame 72 and the supporting component 68 clamp the base 54 together. On the contrary, if the base 54 has to be released from the fixing mechanism 56, the clamping frame 72 is rotated in an opposite direction relative to the base 58, and then the board 54 can be taken away from the pin 82 of the supporting component 68. Because the elastic component 66 contacts against the supporting component 68 and is installed inside the base 58, tiny relative motion can exist between the supporting component 68 and the base 58 when the clamping frame 72 and the supporting component 68 clamp the board 54 together, which means the elastic component 66 can be utilized for absorbing shock. Elasticity of the elastic component 66 can be adjusted for optimizing shock-proof efficiency and for providing design flexibility. The base 54 can be adjusted automatically in a perpendicular direction so as to absorb assembly tolerance, which means the board 54 is screwed in equilibrium with the fixing mechanism 56 and the other fixing mechanisms, so that the fixing mechanism 56 can prevent the board 54 from inducing planar stress and from causing local failure due to stress concentration.

Figure 5:
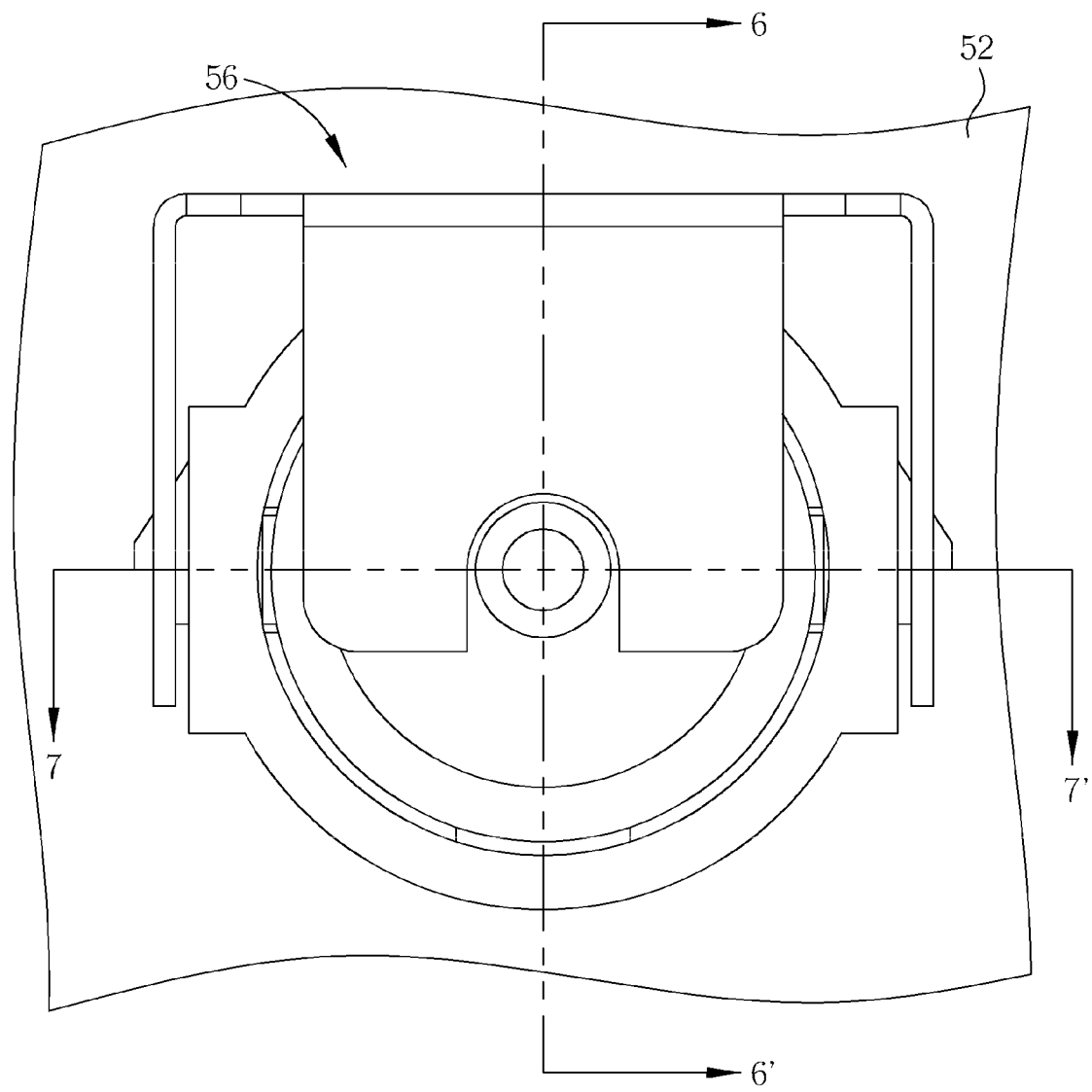
FIG. 5 is a top view of the fixing mechanism installed on the cover of the present invention.
Figure 6:
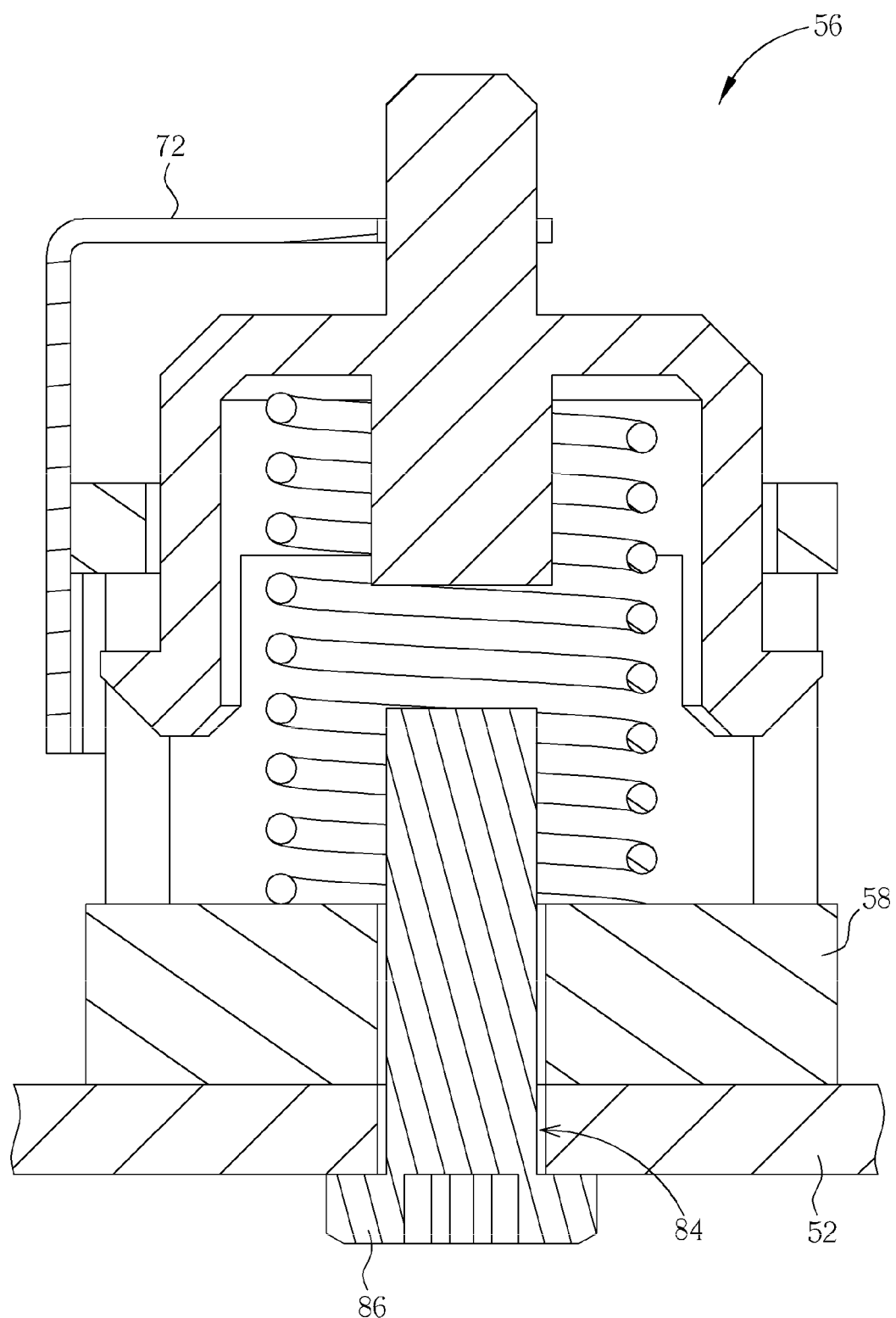
FIG. 6 is a sectional view of the fixing mechanism along line 6-6' shown in FIG. 5 of the present invention.
Figure 7:
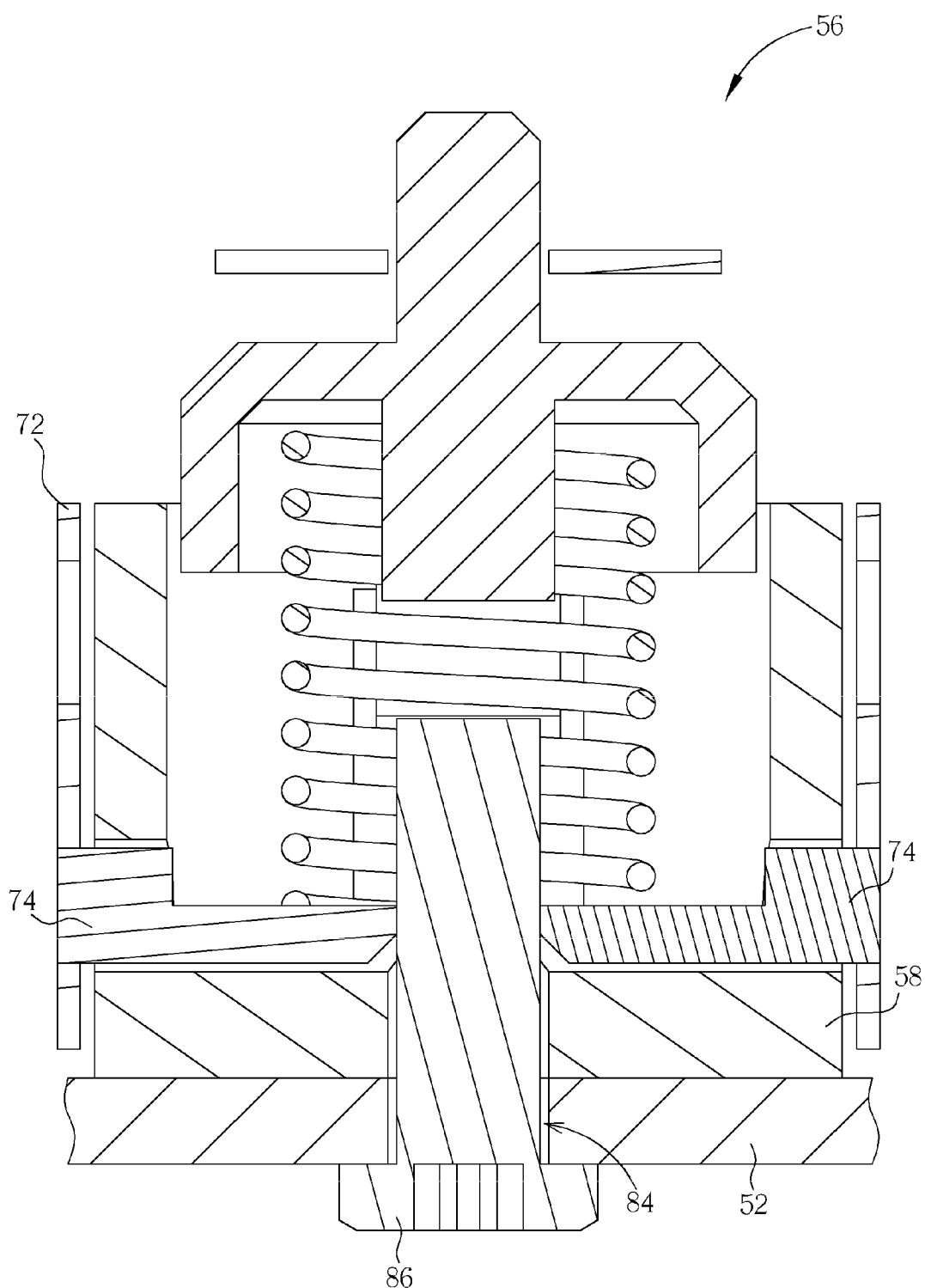
FIG. 7 is a sectional view of the fixing mechanism along line 7-7' shown in FIG. 5 of the present invention.

Please refer to FIG. 5, FIG. 6, and FIG. 7. FIG. 5 is a top view of the fixing mechanism 56 installed on the cover 52 of the present invention. FIG. 6 is a sectional view of the fixing mechanism 56 along a line 6-6' shown in FIG. 5 of the present invention. FIG. 7 is a sectional view of the fixing mechanism 56 along a line 7-7' shown in FIG. 5 of the present invention. The electronic device 50 further includes a grounding portion (not shown in figures) disposed on a side of the base 58, such as on the cover 52. The grounding portion can be made of conductive material formed on the cover 52 by sputtering or evaporating. As shown in FIG. 7, a third hole 84 is formed on the cover 52. The electronic device 50 further includes a fixing component 86 electrically connected to the grounding portion and passing through the third hole 84 for contacting with the shaft 74. That is to say, when the shaft 74 of the clamping frame 72 is inserted into the base 58 so that the clamping frame 72 is pivoted to the base 58, the shaft 74 can contact with the fixing component 86 which passes through the third hole 84 of the cover 52 and the base 58. The third hole 84 can be a tapped hole, and the fixing component 86 can be a grounding component, such as a grounding screw. The fixing component 86 can be installed in a bottom-up direction. When the clamping frame 72 clamps the board 54, the clamping frame 72 can contact with the fixing component 86 via the shaft 74, so that the board 54 can be grounded by contact of clamping frame 72 and the fixing component 86 to ground on the grounding portion of the cover 52.

Figure 8:
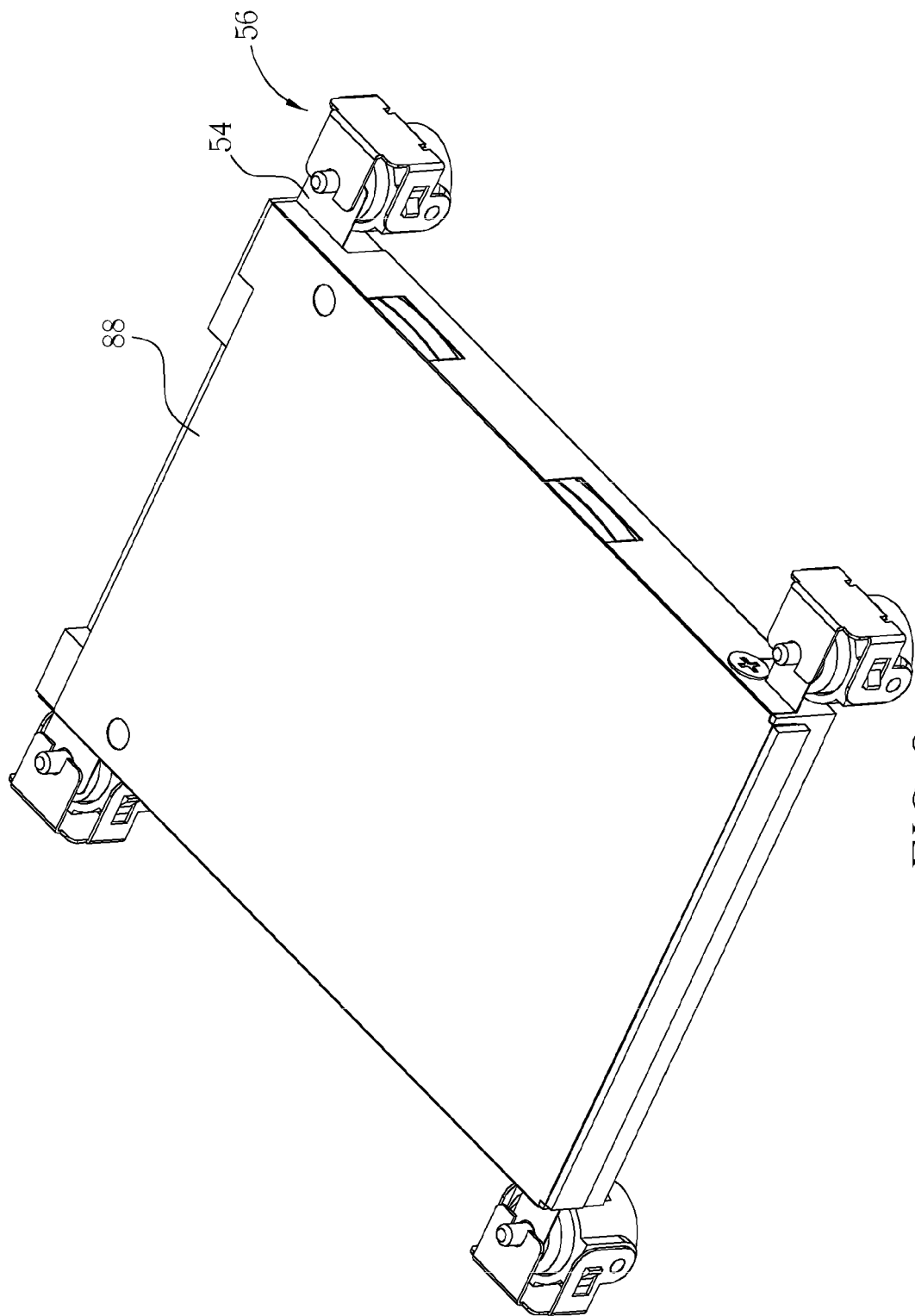
FIG. 8 is a diagram of the fixing mechanism for fixing the board according to the other embodiment of the present invention.

The board 54 not only can be a circuit board, but also can be other kinds of fixing frames. Please refer to FIG. 8. FIG. 8 is a diagram of the fixing mechanism 56 for fixing the board 54 according to another embodiment of the present invention. The electronic device 50 further includes a storage module 88, which can be a hard disc, an optical disk drive, and so on. The board 54 can be a frame for covering the storage module 88. Structure and operating principle of the fixing mechanism 56 for fixing on the board 54 are the same as above-mentioned embodiment, and the detail description is omitted herein for simplicity. The fixing mechanism of this embodiment can provide a shock-proof function effectively and can solve drawbacks of assembling deviation when a buffer is installed on a bottom of the hard disc. The fixing mechanism of this embodiment can absorb vibration or shock effectively when the hard disk vibrates or falls down.

Comparing to the prior art, the fixing mechanism of the present invention utilizes the rotational clamping frame to fix the board, so that the assembling process can be simplified and probability of the assembling failures can be decreased. Because the fixing mechanism of the present invention is assembled easily, labor hours and labor cost can be economized. In addition, the fixing mechanism can utilize the elastic component to absorb the shock and to optimize of shock-proof function by adjusting elasticity of the elastic component. Furthermore, the present invention can be suitable for different kinds of boards with different thicknesses by adjusting the elastic component and height of the base, so that the present invention can provide more design flexibility. The present invention can further reduce the assembly tolerance effectively, which means the board can be screwed in equilibrium with the fixing mechanism and the other fixing devices, so that the fixing mechanism can prevent the board from inducing the planar stress and from causing the local failure due to stress concentration, such as preventing electronic components on the circuit board from being broken easily. When the circuit board is impacted, the fixing mechanism of the present invention can absorb the shock effectively.

Those skilled in the art will readily observe that numerous modifications and alterations of the device and method may be made while retaining the teachings of the invention.

What is claimed is:

1. A fixing mechanism comprising:
   a base, whereon a protrusion and a first hole are formed;
   an elastic component installed inside the base;
   a supporting component wedged inside the base, an end of the supporting component contacting against the elastic component and the other end of the supporting component being for supporting a first object;
   a clamping frame pivoted to the base, an slot being formed on the clamping frame, the clamping frame and the supporting component being for clamping the first object together when the protrusion of the base is inserted inside the slot, and the clamping frame comprising a shaft inserted into the first hole so that the clamping frame is pivoted to the base; and
   a fixing component for clamping a second object with the base.

2. The fixing mechanism of claim 1, wherein the base is a hollow cylindrical structure.

3. The fixing mechanism of claim 1, wherein a guiding slot is formed on the base, and the supporting component comprises a hook for hooking inside the guiding slot.

4. The fixing mechanism of claim 1, wherein a second hole is formed on the first object, a breach is formed on an end of the clamping frame, and the supporting component further comprises a pin for inserting into the second hole of the first object and the breach of the clamping frame so as to fix the first object.

5. The fixing mechanism of claim 4 further comprising:
   a grounding portion disposed on a side of the base, wherein the fixing component is a grounding component for electrically connecting to the grounding portion and contacting with the shaft so as to ground the first object.

6. The fixing mechanism of claim 5, wherein the fixing component is a screw.

7. The fixing mechanism of claim 5, wherein the first object is a board.

8. The fixing mechanism of claim 7, wherein the board is a circuit board.

9. The fixing mechanism of claim 1, wherein the elastic component is a spring.

10. An electronic device comprising:
    a cover;
    a board disposed inside the cover; and
    a fixing mechanism for fixing the board inside the cover, the fixing mechanism comprising:
      a base disposed on a side of the cover, whereon a protrusion and a first hole are formed;
      an elastic component installed inside the base;
      a supporting component wedged inside the base, an end of the supporting component contacting against the elastic component and the other end of the supporting component being for supporting the board;
      a clamping frame pivoted to the base, an slot being formed on the clamping frame, the clamping frame and the supporting component being for clamping the first object together when the protrusion of the base is inserted inside the slot, and the clamping frame comprising a shaft inserted into the first hole so that the clamping frame is pivoted to the base; and
      a fixing component for clamping the cover on the base.

11. The electronic device of claim 10, wherein the base is a hollow cylindrical structure.

12. The electronic device of claim 10, wherein a guiding slot is formed on the base and the supporting component comprises a hook for hooking inside the guiding slot.

13. The electronic device of claim 10, wherein a second hole is formed on the board, a breach is formed on an end of the clamping frame, and the supporting component further comprises a pin for inserting into the second hole of the board and the breach of the clamping frame so as to fix the board.

14. The electronic device of claim 10 further comprising:
    a grounding portion disposed on the cover, wherein the fixing component is a grounding component for electrically connecting to the grounding portion and contacting with the shaft so as to ground the board.

15. The electronic device of claim 14, wherein the fixing component is a screw.

16. The electronic device of claim 15, wherein a third hole is formed on the cover and the fixing component passes through the third hole for contacting with the shaft.

17. The electronic device of claim 16, wherein the third hole is a tapped hole.

18. The electronic device of claim 14, wherein the grounding portion is made of conductive material formed on the cover by sputtering or evaporating.

19. The electronic device of claim 14, wherein the board is a circuit board.

20. The electronic device of claim 10 further comprising:
    a storage module, the board being a frame for covering the storage module.

* * * * *

UNITED STATES PATENT AND TRADEMARK OFFICE
CERTIFICATE OF CORRECTION

| | | |
|---|---|---|
| PATENT NO. | : 7,965,496 B2 | |
| APPLICATION NO. | : 12/631846 | |
| DATED | : June 21, 2011 | |
| INVENTOR(S) | : Chen-Yu Li et al. | |

It is certified that error appears in the above-identified patent and that said Letters Patent is hereby corrected as shown below:

On the title page, insert item (30):

-- (30) Foreign Application Priority Data
Mar. 30, 2009 (TW) ............98110535 --.

Signed and Sealed this
Seventh Day of August, 2012

David J. Kappos
*Director of the United States Patent and Trademark Office*